US011401353B2

(12) United States Patent
Polidore et al.

(10) Patent No.: US 11,401,353 B2
(45) Date of Patent: Aug. 2, 2022

(54) PHOTOCURABLE COMPOSITIONS FOR STEREOLITHOGRAPHY, METHOD OF FORMING THE COMPOSITIONS, STEREOLITHOGRAPHY METHODS USING THE COMPOSITIONS, POLYMER COMPONENTS FORMED BY THE STEREOLITHOGRAPHY METHODS, AND A DEVICE INCLUDING THE POLYMER COMPONENTS

(71) Applicant: ROGERS CORPORATION, Chandler, AZ (US)

(72) Inventors: Trevor Polidore, Scottsdale, AZ (US); Dirk Baars, Phoenix, AZ (US); Thomas A. Koes, Riverside, CA (US); Bruce Fitts, Phoenix, AZ (US); Murali Sethumadhavan, Acton, MA (US)

(73) Assignee: ROGERS CORPORATION, Chandler, AZ (US)

(*) Notice: Subject to any disclaimer, the term of this patent is extended or adjusted under 35 U.S.C. 154(b) by 0 days.

(21) Appl. No.: 16/887,320

(22) Filed: May 29, 2020

(65) Prior Publication Data

US 2020/0377628 A1 Dec. 3, 2020

Related U.S. Application Data

(60) Provisional application No. 62/854,387, filed on May 30, 2019.

(51) Int. Cl.
| | |
|---|---|
| *C08F 2/46* | (2006.01) |
| *C08F 2/50* | (2006.01) |
| *C08G 61/04* | (2006.01) |
| *B29C 64/106* | (2017.01) |
| *C08F 22/10* | (2006.01) |
| *C08F 20/18* | (2006.01) |
| *C08F 22/20* | (2006.01) |
| *C08F 22/22* | (2006.01) |
| *C08F 136/06* | (2006.01) |
| *C08K 3/22* | (2006.01) |
| *B33Y 10/00* | (2015.01) |
| *B33Y 70/00* | (2020.01) |
| *B33Y 80/00* | (2015.01) |
| *B29K 33/00* | (2006.01) |
| *B29K 35/00* | (2006.01) |

(52) U.S. Cl.
CPC .............. *C08F 2/50* (2013.01); *B29C 64/106* (2017.08); *C08F 20/18* (2013.01); *C08F 22/1006* (2020.02); *C08F 22/20* (2013.01); *C08F 22/22* (2013.01); *C08F 136/06* (2013.01); *C08K 3/22* (2013.01); *B29K 2033/08* (2013.01); *B29K 2035/00* (2013.01); *B29K 2995/0006* (2013.01); *B33Y 10/00* (2014.12); *B33Y 70/00* (2014.12); *B33Y 80/00* (2014.12); *C08K 2003/2227* (2013.01); *C08K 2003/2237* (2013.01)

(58) Field of Classification Search
CPC ........ B29C 64/106; C08F 22/20; C08F 22/22; C08F 22/1006; C08F 136/06; C08F 7/027; C08F 20/18; C08F 2/50; B33Y 10/00; B33Y 80/00; B33Y 70/00; G03F 7/0037; C08K 3/22; C08K 2003/2227; C08K 2003/2237; B29K 2995/0006; B29K 2035/00; B29K 2033/08
USPC ......... 522/153, 150, 1, 161, 6, 189, 184, 71; 520/1
See application file for complete search history.

(56) References Cited

U.S. PATENT DOCUMENTS

| | | | |
|---|---|---|---|
| 4,575,330 | A | 3/1986 | Hull |
| 4,929,402 | A | 5/1990 | Hull |
| 5,104,592 | A | 4/1992 | Hull et al. |
| 5,184,307 | A | 2/1993 | Hull et al. |
| 5,192,559 | A | 3/1993 | Hull et al. |
| 5,234,636 | A | 8/1993 | Hull et al. |
| 5,236,637 | A | 8/1993 | Hull |
| 5,273,691 | A | 12/1993 | Hull et al. |

(Continued)

FOREIGN PATENT DOCUMENTS

| | | | |
|---|---|---|---|
| JP | 40665334 | A | 3/1994 |
| WO | 9513565 | A1 | 5/1995 |

(Continued)

OTHER PUBLICATIONS

Keysight Technologies; "Split Post Dielectric Resonators for Dielectric Measurements of Substrates"; Keysight Technologies, Dec. 2, 2017; 5989-5384EN, pp. 1-11.

(Continued)

*Primary Examiner* — Jessica Whiteley
(74) *Attorney, Agent, or Firm* — Cantor Colburn LLP

(57) ABSTRACT

A photocurable composition for stereolithographic three-dimensional printing, wherein the photocurable composition comprises a photoreactive oligomer component comprising a hydrophobic oligomer comprising a photoreactive end group, a photoreactive monomer component comprising a photoreactive monomer having a photoreactive end group, and a photoinitiation composition comprising a photoinitiator; the photocurable composition has a viscosity of 250 to 10,000 centipoise at 22° C., determined using a Brookfield viscometer; and the photocured composition has a dielectric loss of less than 0.010, preferably less than 0.008, more preferably less than 0.006, most preferably less than 0.004, each determined by split-post dielectric resonator testing at 10 gigahertz at 23° C.

29 Claims, No Drawings

(56) References Cited

U.S. PATENT DOCUMENTS

| | | | |
|---|---|---|---|
| 5,476,749 A * | 12/1995 | Steinmann | B29C 64/135 430/269 |
| 6,855,478 B2 | 2/2005 | DeVoe et al. | |
| 7,179,844 B2 | 2/2007 | Aki | |
| 7,534,844 B2 | 5/2009 | Lee et al. | |
| 7,550,246 B2 | 6/2009 | Fukuzumi et al. | |
| 7,649,029 B2 | 1/2010 | Kolb et al. | |
| 7,767,728 B2 | 8/2010 | Lu et al. | |
| 7,824,839 B2 | 11/2010 | Ober et al. | |
| 7,935,476 B2 | 5/2011 | Teng | |
| 8,119,214 B2 | 2/2012 | Schwantes et al. | |
| 8,232,043 B2 | 7/2012 | Williamson et al. | |
| 9,205,601 B2 | 12/2015 | Desimone et al. | |
| 2008/0079182 A1 | 4/2008 | Thompson et al. | |
| 2008/0193749 A1 | 8/2008 | Thompson et al. | |
| 2010/0051340 A1 | 3/2010 | Yang et al. | |
| 2011/0204531 A1 | 8/2011 | Hara et al. | |
| 2016/0107290 A1 | 4/2016 | Bajaj et al. | |
| 2017/0225395 A1 | 8/2017 | Boydston et al. | |
| 2017/0360534 A1 * | 12/2017 | Sun | A61C 13/0019 |
| 2018/0282550 A1 | 10/2018 | Burgess et al. | |
| 2020/0083602 A1 | 3/2020 | Sethumadhavan et al. | |
| 2020/0083610 A1 | 3/2020 | Pance et al. | |
| 2020/0122387 A1 | 4/2020 | Polidore et al. | |
| 2021/0328356 A1 | 10/2021 | Polidore et al. | |

FOREIGN PATENT DOCUMENTS

| | | |
|---|---|---|
| WO | 2012129968 A1 | 10/2012 |
| WO | 2014126837 A2 | 8/2014 |
| WO | 2016153711 A1 | 9/2016 |
| WO | 2017040883 A1 | 3/2017 |

OTHER PUBLICATIONS

Krupka et al.; "Split post dielectric resonator technique for precise measurements of laminar dielectric specimens -Measurement uncertainties"; IEEE Xplore Conference Paper Feb. 2000, pp. 305-308.

Krupka J., Gregory A.P., Rochard O.C., Clarke R.N., Riddle B., Baker-Jarvis J., Uncertainty of Complex Permittivity Measurement by Split-Post Dielectric Resonator Techniques, Journal of the European Ceramic Society, No. 10, pp. 2673-2676, 2001.

Krupka, J., Geyer, R.G., Baker-Jarvis, J., Ceremuga, J., Measurements of the complex permittivity of microwave circuit board substrates using split dielectric resonator and reentrant cavity techoniques. Seventh International Conference on Dielectric Materials, Measurements and Applications, (Conf. PubL No. 430), pp. 21-24, Sep. 1996.

International Search Report for International Application No. PCT/US2020/035120; International Filing Date May 29, 2020, dated Oct. 1, 2020, 6 pages.

Written Opinion for International Application No. PCT/US2020/035120; International Filing Date May 29, 2020, dated Oct. 1, 2020, 9 pages.

IPRP for International Application No. PCT/US2020/035120; International Filing Date May 29, 2020, dated Jun. 24, 2021, 13 pages.

"New 3D Printed Electromagnetic Lense from OmniPreSense"; URL: http://www.microwavejournal.com/articles/31133-new-3d-printed-electromagnetic-lens-from-omnipresense; Date of Access: Oct. 16, 2018; 8 pages.

Buerkle, A et al.; "Fabrication of a DRA Array Using Ceramic Stereolithography"; IEEE Antennas and Wireless Popagation Letters; IEEE; vol. 5 No. 1, Jan. 2007; pp. 479-481.

Kakade, Anandrao, et al.; Mode Excitation in the Coaxial Probe Coupled Three-Layer Hemispherical Dielectric Resonator Antenna; IEEE Transactions on Antennas and Propagation; vol. 59; No. 12; Dec. 2011; 7 pages.

Lei, Juan et al., "Experimental demonstration of conformal phased array antenna via transformation optics," Scientific Reports, vol. 8, No. 1, Feb. 28, 2018, 14 pages.

Liang, M. et al.; "A 3-D Luneburg lens antenna fabricated by polymer jetting rapid prototyping," IEEE Transactions on Antennas and Propagation, 62(4), Apr. 2014, 1799-1807.

Zhang Shiyu et al.; "3D-Printed Graded Index Lenses for RF Applications"; ISAP 2016 International Symposium on Antennas and Propagation, Okinawa, Japan ; pp. 1-27.

* cited by examiner

PHOTOCURABLE COMPOSITIONS FOR STEREOLITHOGRAPHY, METHOD OF FORMING THE COMPOSITIONS, STEREOLITHOGRAPHY METHODS USING THE COMPOSITIONS, POLYMER COMPONENTS FORMED BY THE STEREOLITHOGRAPHY METHODS, AND A DEVICE INCLUDING THE POLYMER COMPONENTS

CROSS-REFERENCE TO RELATED APPLICATION

This application claims the benefit of and priority to U.S. Provisional Application No. 62/854,387, filed May 30, 2019, the content of which is incorporated herein by reference in its entirety.

BACKGROUND

This disclosure is directed to a photocurable composition for stereolithography, a method of forming the photocurable composition, a stereolithographic method using the composition, a component formed by the stereolithographic method, and a device including the component.

Additive manufacturing (AM), which includes 3-dimensional (3D) printing and solid free-form fabrication, allows the production of three-dimensional objects of virtually any shape from a digital model. Generally, this is achieved by creating a digital blueprint of a desired structure with computer-aided design (CAD) modeling software and then slicing that virtual blueprint into digital cross-sections. These cross-sections are formed or deposited in a sequential layering process to create the 3D structure.

One application of AM is the formation of electronic components for use in high frequency wireless transmission such as antenna elements, radomes, and lenses. Stereolithography apparatus (SLA) printing is a preferred method of AM for forming these components because of the high print speeds and high-resolution capability. A wide variety of materials have been developed for use in SLA printing, but these materials have high dielectric loss factors (Df) of greater than 0.01 when measured at high frequency such as 10 gigahertz. Therefore, there remains a need in the art for improved materials to provide printed structures having Df of less than 0.01 at 10 gigahertz.

BRIEF SUMMARY

A photocurable composition for stereolithographic three-dimensional printing is disclosed, wherein the photocurable composition comprises a photoreactive oligomer component comprising a hydrophobic oligomer comprising photoreactive end groups, a photoreactive monomer component, and a photoinitiation composition comprising a photoinitiator; the photocurable composition has a viscosity of 250 to 10,000 centipoise at 22° C., determined using a Brookfield viscometer; and the photocured composition has a dielectric loss of less than 0.010, preferably less than 0.008, more preferably less than 0.006, and most preferably less than 0.004, each determined by split-post dielectric resonator testing at 10 gigahertz (GHz).

Also disclosed is a method for the manufacture of a photocured three-dimensional structure using the photocurable composition.

The photocured three-dimensional structures made by the above method are also disclosed.

In another aspect, an electronic device comprises photocured three-dimensional structure.

The above described and other features are exemplified by the following figures, detailed description, examples, and claims.

DETAILED DESCRIPTION

Stereolithography is a specialized 3D printing method also referred to in the art as optical fabrication, photosolidification, and resin printing. Any of the foregoing methods can be used herein and are referred to collectively as "SLA" methods. In these methods, successive thin layers of a liquid resin are selectively photocured using a light source. The light source can be located at either the top or the bottom of the stack of layers. Photocurable compositions are available for use in SLA printing, but there remains a need in the art for compositions that provide photocured components having very low dielectric loss and are suitable for use in electronic devices operating at high frequency. As is known in the art, developing a photocurable composition that can be used in SLA printing to provide a desired set of properties requires a careful balancing of properties needed for efficient SLA manufacture and the desired properties in the photocured component. Efficient SLA manufacture relies on photocurable compositions having a narrow range of suitable viscosity and photocure time. This is particularly difficult to achieve for advanced materials designed for very low loss electronic components. Such components are needed for higher operating frequencies such as in 5G networks, for example. Suitable materials have a narrow window of desirable properties that are difficult to achieve using any manufacturing method, including most notably very low loss (e.g., a Df less than 0.01 at 10 gigahertz (GHz)). Achieving SLA-printable compositions for very low loss electronic components is particularly difficult because any single change to attain a desired property such as low loss can adversely affect printability of the photocurable composition, and any change to improve printability of the composition can adversely affect the desired properties of the photocured polymer.

The inventors hereof have discovered photocurable compositions that permit efficient manufacture of three-dimensional polymeric structures using SLA manufacturing methods, and that provide photocured polymer compositions having very low loss, in particular having a dissipation factor (Df) of less than 0.01 when measured at 10 GHz. The compositions are specific formulations that can further provide three-dimensional polymer articles with other desired properties for use in electronic components, especially those operating at high frequency.

The SLA printable compositions are photocurable and include a specific photoreactive oligomer component and photoreactive monomer component, together with a photoinitiator system and an optional ceramic filler.

The photoreactive oligomer component includes a hydrophobic, nonpolar or amphipathic oligomer comprising a reactive group that can participate in a photocuring reaction, i.e., a free-radically photopolymerizable group. The oligomeric backbones of the photoreactive oligomers are preferably nonpolar or amphipathic, and hydrophobic, and typically comprise hydrocarbon repeat units or aliphatic ester repeat units. As is known in the art, hydrophobicity is correlated with materials that are less likely to accept or donate hydrogen bonds to water. For example, a preferred hydrophobic oligomer backbone is a polybutadiene, which comprises a non-polar, hydrophobic segment. Another hydrophobic oligomer backbone is a poly($C_{4-6}$ alkylene) ester backbone. Additional functional groups can be present in the backbone, as linkers, for example carbamate ester (urethane), ether, ester, amide, ketone, and the like, which can render some degree of amphipathic character to the backbone.

At least one photoreactive group is present in the photoreactive oligomer, preferable as an end (i.e., terminal) group. More preferably, more than one photoreactive group is present as an end group, i.e., at least two photoreactive terminal groups are present. Such groups can include alkenyl groups such as vinyl and allyl, as well as (meth)acryloyl end groups such as acrylate and methacrylate. Free-radically photopolymerizable groups can also include terminal alkynyl groups such as terminal propargyl (2-propynyl). Preferred photoreactive end groups are (meth)acrylates, which as used herein includes both acrylate and methacrylate groups. Even more preferred are methacrylate end groups.

The photoreactive oligomers are commercially available or can be manufactured by methods known in the art from precursors that include reactive functional groups such as hydroxyl, carboxylic acid, isocyanate. For example, a (meth)acrylate-functional oligomeric polyester or a (meth)acrylate-functional oligomeric polyurethane can be derived from the following categorized precursors (Category A through Category G):

Category A:
Aliphatic polybasic carboxylic acids such as succinic acid, adipic acid, azelaic acid, sebacic acid, 1,2,4-butanetricarboxylic acid and 1,2,3,4-butanetetracarboxylic acid.
Cycloaliphatic polybasic carboxylic acids such as 1,2-, 1,3-, 1,4-cyclohexanedicarboxylic acid, hexahydrophthalic acid and hexahydroterephthalic acid.
Aromatic polybasic carboxylic acids such as phthalic acid, isophthalic acid, terephthalic acid, trimellitic acid, pyromellitic acid, naphthalene dicarboxylic acid, 4,4'-diphenyldicarboxylic acid, and diphenylmethane-4,4'-dicarboxylic acid.
Anhydrides such as hexahydrotrimellitic acid and methyl hexahydrophthalic acid.
Alkenyl polybasic carboxylic acids such as maleic acid, fumaric acid, itaconic acid, HET acid, tetrahydrophthalic acid.

Category B:
Aliphatic polyhydric alcohols such as ethylene glycol, propylene glycol, 2,3-dimethyltrimethylene glycol, 1,2-, 1,3-, 1,4-butanediol, 2,3-butanediol, 3-methyl-1,2-butanediol, 1,2-, 1,4-, 1,5-pentanediol, 2,4-pentanediol, 3-methyl-4,5-pentanediol, 2,2,4-trimethyl-1,3-pentanediol, neopentyl glycol, 1,4-, 1,5-, 1,6-hexanediol, 2,5-hexanediol, 1,2,6-hexanetriol, trimethylolpropane, trimethylolethane, pentaerythritol and glycerol.
Polyether polyhydric alcohols such as diethylene glycol, triethylene glycol, tetraethylene glycol, dipropylene glycol, dipentaerythritol, diglycerol, spiroglycol and triglycerol.
Cycloaliphatic polyhydric alcohols such as tricyclodecane dimethanol, 1,3-, 1,4-cyclohexane dimethanol, hydrogenated bisphenol A and hydrogenated bisphenol F.
Aromatic polyhydric alcohols such as bis(hydroxyethyl) terephthalate.
Alkenyl polyhydric alcohols such as hydroxyl-terminated-polybutadiene.

Category C
Polyester polyols derived from the ring opening polymerization of lactones such as β-propiolactone, γ-butyrolactone, α-methyl-γ-butyrolactone, δ-valerolactone, ε-caprolactone, α-chloro-ε-caprolactone, γ-methyl-ε-caprolactone, ε-heptalactone, ε-decalactone, ω-pentadecalactone and 7-isopropyl-4-methyloxepan-2-one.
Alkenyl polyester polyols derived from the ring opening polymerization of lactones such as α-methylene-γ-butyrolactone, 4-isopropenyl-7-methyloxepan-2-one, and α-propargyl-ε-caprolactone.

Category D
Aliphatic diisocyanates such as hexamethylene diisocyanate (HMDI), trimethylhexamethylene diisocyanate.
Cycloaliphatic diisocyanates such as isophorone diisocyanate (IPDI), cyclohexane-1,4-diisocyanate and 4,4'-dicyclohexylmethane diisocyanate (hydrogenated MDI).
Aromatic diisocyanates such as 2,4-tolylene diisocyanate (2,4-TDI), 2,6-tolylene diisocyanate (2,6-TDI), 4,4'-diphenylmethane diisocyanate, 1,4-phenylene diisocyanate, 1,5-naphthalene diisocyanate, xylylene diisocyanate, and tetramethylxylylene diisocyanate.

Category E
Isocyanates containing an α,β-unsaturated ketone such as (meth)acryloylisocyanate and 2-isocyanatoethyl (meth)acrylate.
Isocyanates containing photoreactive alkenes such as m-,p-isopropenyl-α,α'-dimethylbenzyl isocyanate and vinyl isocyanate.

Category F
Hydroxy-containing α,β-unsaturated ketone monomers such as 2-hydroxyethyl (meth)acrylate, 3-hydroxypropyl (meth)acrylate, 4-hydroxybutyl (meth)acrylate, polyethylene glycol mono(meth)acrylate, and 2-hydroxy-3-phenoxypropyl (meth)acrylate.

Category G
α,β-unsaturated carboxylic acid monomers such as (meth)acrylic acid and β-carboxyethyl (meth)acrylate.

In particular, at least one member from at least two different categories are reacted. Photoreactive (meth)acrylate-functional oligomeric polyesters can be prepared by reacting the above category-specific materials to produce a variety of structural sequences. For example, reaction of a component from category F and G can be used to produce a polyester of sequence FG. Other sequences that can be produced include FCG, FAF, GBAF, GBCG, FCACF and GBABG.

Photoreactive (meth)acrylate functional oligomeric polyurethanes can also be prepared by reacting the above category specific materials to produce the following structural sequences, for example: FE, EBE, FCE, FDF, GBE, FDBDF, FCDCF and EBABE.

The number average molecular weight of the photoreactive, hydrophobic oligomer can be 250 to 10,000 grams per mole (g/mol), for example 500 to 5,000 g/mol, 700 to 5,000 g/mol ole, or 1,000 to 4,000 g/mol.

A preferred photoreactive oligomer is a (meth)acrylate-functional oligomeric polyester containing an aliphatic urethane linking group, and produced by reaction of caprolactone, hydroxyethyl acrylate, acrylic acid, and 4,4'-dicyclohexyl diisocyanate. Other diisocyanates as described below can be used. Preferred oligomers of this type are commercially available from Sartomer (Arkema Group), for example under the trade name CN 9014 NS.

Another preferred photoreactive oligomer is a urethane (meth)acrylate-derivatized polybutadiene oligomer. Such oligomers can be obtained by derivatization of a hydroxyl-terminated polybutadiene with a ($C_{1-6}$-alkyl)(meth)acrylate-functionalized isocyanate.

The hydroxyl-terminated polybutadiene can have a structure of formula (1)

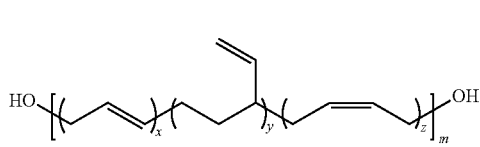

(1)

wherein x, y, and z are molar ratios of each unit, can vary from 0 to 1, and x+y+z=1.

The ($C_{1-6}$-alkyl)(meth)acrylate-functionalized isocyanate can be of formula (2)

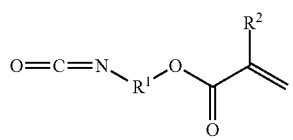

(2)

wherein $R^1$ is a $C_{3-36}$ organic group and $R^2$ is hydrogen or methyl. Examples wherein $R^1$ is ethyl include acryloyloxyethyl isocyanate and methacryloyloxyethyl isocyanate. In an aspect $R^1$ is a substituted or unsubstituted $C_{6-36}$ aromatic group, preferably a substituted $C_{7-15}$ aromatic group. Compounds of formula (2) can be derived from diisocyanates. Examples of such diisocyanates include 2,4-toluene diisocyanate, 2,6-toluene diisocyanate, 4,4'-diphenyl methane diisocyanate (MDI), 4,4'-dicyclohexyl diisocyanate, m- and p-tetramethyl xylylene diisocyanate, 3-isocyanatomethyl-3,5,5-trimethyl cyclohexyl isocyanate (isophorone diisocyanate), hexamethylene diisocyanate (HMDI), 1,5-naphthylene diisocyanate, dianisidine diisocyanate, di-(2-isocyanatoethyl)-bicyclo[2.2.1]hept-5-ene-2,3-dicarboxylate, 2,2,4- and 2,4,4-trimethylene hexamethylene diisocyanate. Compounds of formula (2) can also be derived from the reaction of diisocyanates with (meth)acrylic hydroxy compounds such as 2-hydroxyethyl acrylate and 2-hydroxy ethyl methacrylate. In an aspect the diisocyanate may comprise isophorone diisocyanate, methylene-bis-phenyl diisocyanate, toluene diisocyanate, hexamethylene diisocyanate, m-tetramethylxylylene diisocyanate, or a combination thereof. Further in formula (2), $R^2$ is preferably hydrogen.

In an aspect the urethane (meth)acrylate-derivatized polybutadiene oligomer has a structure of formula (1)

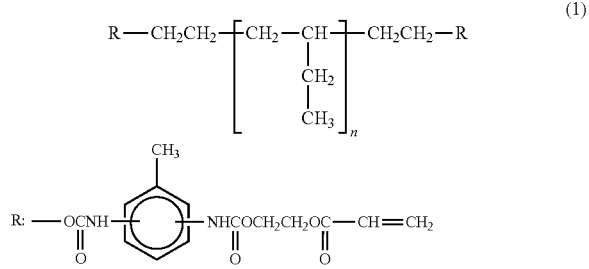

(1)

wherein n is 10 to 1000 and is selected to provide a number average molecular weight within the above range. Also, a urethane methacrylate-derivatized polybutadiene oligomer of formula (2) can be used,

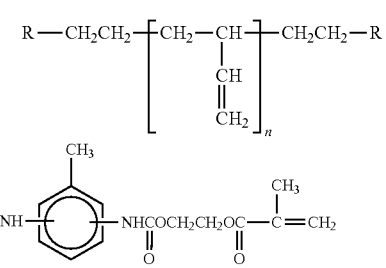

(2)

wherein n is 10 to 1000 and is selected to provide a number average molecular weight within the above range. In formulas 1 and 2, each n can be independently selected. A combination of different urethane (meth)acrylate-derivatized polybutadienes can be used.

A preferred oligomer is a urethane (meth)acrylate-derivatized polybutadiene oligomer having a specific molecular weight range. The number average molecular weight is 500 to 5,000 g/mol, 700 to 5,000 g/mol, or 1,000 to 4,000 g/mol. Suitable urethane methacrylate-derivatized polybutadienes are commercially available, for example from Dymax, Sartomer, or Nippon Soda.

The photocurable compositions further comprise a photoreactive monomer component to adjust the viscosity of the overall composition and to provide crosslinking with the photoreactive oligomer. The photoreactive monomers can include one or more free-radically photopolymerizable groups such as (meth)acrylate groups. Preferably functional groups other than alkenyl, alkynyl, or (meth)acryl groups are not present, such as carboxylic acid, hydroxyl, sulfhydryl, and amino groups. In a surprising aspect, it has been found that methacrylate groups are preferred, as methacrylate-terminated compounds provide an improved combination of properties (see, e.g., Table 1). In particular, it has been found that the best results are obtained when the photocurable components of the composition (the oligomer and monomer components) comprise 20 wt % or less of monomers containing terminal acrylate groups (see, e.g., Example, 4, Table 6).

Suitable photoreactive monomers can be mono-, di-, tri-, tetra-, or penta-functional, having 1, 2, 3, 4, or 5 unsaturated groups respectively, preferably 1, 2, or 3 (meth)acrylate groups. A combination of different monomers can be used, for example a monofunctional monomer and a difunctional monomer. Exemplary photoreactive monomers can include aromatic groups, or cyclic or acyclic aliphatic groups. Exemplary aromatic monomers include benzyl(meth)acrylate, naphthyl(meth)acrylate, phenoxyethyl(meth)acrylate, and phenyl(meth)acrylate. In an aspect, no aromatic (meth)acrylates are present in the photocurable compositions.

Preferably the photoreactive monomers are cyclic or acyclic aliphatic monomers to provide low Df. Exemplary cyclic aliphatic (meth)acrylate monomers include cyclopentyl(meth)acrylate, cyclohexyl(meth)acrylate, cyclohexyldi(meth)acrylate and isobornyl(meth)acrylate.

Exemplary acyclic aliphatic (meth)acrylate monomers include ($C_{1-18}$ alkyl) (meth)acrylates such as methyl methacrylate, ethyl methacrylate, iso-butyl(meth)acrylate, tert-butyl(meth)acrylate, iso-decyl(meth)acrylate, lauryl(meth)

acrylate, stearyl(meth)acrylate, ethoxyethoxyethyl(meth) acrylate (ethyl carbitol (meth)acrylate)), 1,2-, 1,3-, and 1,4-butanediol di(meth)acrylate, 1,2-, 1,3-, 1,4-, 1,5- and 1,6-hexanediol di(meth)acrylate and combinations thereof, ethyleneglycol di(meth)acrylate, propylene glycol di(meth) acrylate, diethyleneglycol di(meth)acrylate, triethyleneglycol di(meth)acrylate, polyethylene glycol di(meth)acrylate, dipropyleneglycol di(meth)acrylate, triethyleneglycol di(meth)acrylate, glycerol tri(meth)acrylate, 1,2- and 1,3-propanediol di(meth)acrylate, ethoxylated trimethylolpropane tri(meth)acrylate, trimethylolpropane tri(meth)acrylate, pentaerythritol tetra(meth)acrylate, or tris (2-hydroxyethyl) isocyanurate tri(meth)acrylate.

Although (meth)acrylates are preferred, other alkenyl photoreactive monomers can be present, such as triallyl isocyanurate, allyl(meth)acrylate, pentaerythritol diallyl ether, pentaerythritol triallyl ether, pentaerythritol tetraallyl ether, diallyl ether, tetraallyloxyethane, tetraallyloxypropane, tetraallyloxybutane, styrene, alpha-methyl styrene, divinylbenzene, divinyltoluene, diallyl phthalate, divinyl xylene, trivinyl benzene, or divinyl ether.

Although (meth)acrylates are preferred, other alkynyl photoreactive monomers can be present, such as dipropargyl, phenyl propargyl ether, benzyl propargyl ether, propargyl benzoate, propargyl ether, or tripropargyl cyanurate.

The photoreactive monomers used can possess combinations of (meth)acryloyl, alkenyl, and alkynyl functional groups such as vinyl (meth)acrylate, allyl (meth)acrylate, propargyl (meth)acrylate, vinyl acetylene, allyl vinyl acetylene, N,N-methylene bisacrylamide, N,N-methylenebismethacrylamide, or allyl vinyl ether.

The inventors hereof have found that certain photoreactive monomers are especially suitable for use in the photocurable monomer components, including isobornyl (meth) acrylate, ethylene glycol dimethacrylate, 1,6-hexanediol di(meth)acrylate, trimethylolpropane tri(meth)acrylate, 2-ethylhexyl (meth)acrylate, hydroxypropyl methacrylate, 1,3-butanediol dimethacrylate, or a combination thereof. The isobornyl (meth)acrylate can be isobornyl methacrylate or isobornyl acrylate. A combination can be used. The 1,6-hexanediol di(meth)acrylate can be 1,6-hexanediol dimethacrylate or 1,6-hexanediol diacrylate. A combination can be used. As illustrated in the examples, use of these monomers provides the desired degree of cure (crosslinking and polymerization) to achieve a Df of less than 0.01 when measured at 10 GHz, and to prevent the migration of lower molecular weight components from the photocured polymer.

Generally, the photocurable compositions can include 25 to 85 weight percent (wt %) of the photoreactive oligomer component; 25 to 65 wt % of the photoreactive monomer component; and 0.1 to 15 wt %, preferably 0.1 to 5 wt %, of the photoinitiation composition, wherein each weight percent is based on the total weight of the photoreactive oligomer component, the photoreactive monomer component, and the photoinitiation composition, and totals 100 weight percent. In another aspect, the photocurable compositions can include 35 to 85 wt % of the photoreactive oligomer component; 15 to 65 wt % of the photoreactive monomer component; and 0.1 to 15 weight, preferably 0.1 to 5 wt %, of the photoinitiation composition, wherein each weight percent is based on the total weight of the photoreactive oligomer component, the photoreactive monomer component, and the photoinitiation composition, and totals 100 weight percent.

It has been surprisingly found that an advantageous combination of viscosity, cure speed, degree-of-cure, and physical properties in the photocured components can be obtained using specific amounts of each monomer together with the addition of a particulate ceramic filler, where the amounts vary for each monomer and ceramic filler. In particular, use of the specific components in specific amounts can provide a viscosity that has sufficient flow and self-leveling characteristics, together with fast cure for use in SLA methods, as well as low loss and other properties such as low moisture absorption in the photocured composition. Use of a particulate ceramic filler can be used to adjust both viscosity and dielectric constant. It can especially enable attainment of a wider range of dielectric constant. Finally, use of filler can enable use of less high cost components lowering overall cost of the composition.

Accordingly, the photocurable composition can optionally comprise a particulate ceramic filler to adjust the properties of the photocured component, in particular the dielectric constant. In a preferred embodiment the particulate filler is present, at least in part to adjust the dielectric constant of the photocured component to the desired range. The particulate filler can comprise silica, alumina, calcium titanate ($CaTiO_3$), strontium titanate ($SrTiO_3$), barium titanate ($BaTiO_3$), barium nonatitanate ($Ba_2Ti_9O_{20}$), boron nitride, aluminum nitride, or a combination thereof.

Using higher dielectric constant (Dk) fillers can enable the manufacture of porous structures, and still achieve the desired Dk. Preferred high dielectric constant fillers include silica, alumina, strontium titanate, barium nonatitanate, or a combination thereof. In some applications, more air is desirably incorporated into the porous structure. In these structures a particulate filler having a Dk of 5 or greater is desired, for example alumina, strontium titanate, barium titanate, barium nonatitanate, or a combination thereof.

Other fillers can be used, provided that the filler does not significantly adversely affect the cure or desired Dk of the photocurable composition. For example, to avoid significantly adversely affecting the cure of the photocurable composition, opaque fillers such as many grades of titanium dioxide (titania) are minimized, and are preferably excluded. To the extent that a filler such as a nanosized titania does not significantly adversely affect the length of cure or the degree of cure, the filler can be present. To further avoid significantly adversely affecting the cure of the photocurable composition, the particulate filler can have a refractive index that is within a factor of two, for example, within a factor of 1.5, or within 1.25, or within 1 of a refractive index of the photocured composition at the wavelength of curing.

When present, the particulate filler is used in an amount of 5 to 60 volume percent (vol %) of the photocurable composition, or 10 to 50 vol %, or 10 to 40 vol %, or 10 to 30 vol %, each based on the total volume of the photocurable composition, including the particulate filler. The particle size of the filler is selected to provide both adequate flow of the photocured composition, as well as the desired electrical and mechanical properties. For example, the filler can have a median particle size of less than 25 micrometers, or less than 15 micrometers.

The particulate filler can be coated with a dispersant to improve the dispersion of the filler in the photocurable composition. The dispersant can comprise an alkyl silane coating, an alkenyl silane coating, an alkynyl silane coating, a (meth)acryloyl silane coating, an amino silane coating, a chlorinated silane coating, a fluorinated alkyl silane coating, a zirconate coating, a titanate coating, or a combination thereof. The coating agent can comprise phenyltrimethoxysilane, p-chloromethylphenyltrimethoxy silane, aminoethylaminotrimethoxy silane, aminoethylaminopropyltrimethoxy silane, 3-acryloxypropyltriethoxy silane, 3-methacryloxypropyltrimethoxy silane, allyltrimethoxy silane, vinyltriethoxy silane, o-(propargyloxy)-n-(triethoxysilylpropyl) urethane, phenyltriethoxysilane, 3,3,3-trifluoropropyltrimethoxysilane, (tridecafluoro-1,1,2,2-tetrahydrodecyl)-1-triethoxysilane, neopentyl(diallyl)oxytri(dioctyl) pyrophosphate zirconate, neopentyl(diallyl)oxytri(N-ethylenediamino)ethyl zirconate, oleyl titanate, or a combination thereof. In as aspect the dispersant is a silane coating such as phenyltrimethoxysilane or a titanate coating such as oleyl titanate.

The particulate filler can be pretreated with the coating agent prior to forming the composition, or the coating agent can be added to the composition. The coating can be present in an amount of 0.1 to 2.0 wt %, or 0.3 to 1.2 wt %, based on the total weight of the particulate filler.

The photocurable composition further comprises a photoinitiation composition, which comprises a free radical photoinitiator, a compound that produces free radicals upon exposure to radiation such as ultraviolet and/or visible radiation, in an amount sufficient to initiate a polymerization reaction. The free-radical photoinitiator can be a single compound, a mixture of two or more active compounds, or a combination of two or more different compounds (such as co-initiators).

In an aspect, the free radical photoinitiator is preferably an ultraviolet light photoinitiator. Such photoinitiators include acetophenones, benzophenones, benzoin ethers, thioxanthones, thioxanthone-fluorenes, coumarin, ketocoumarin, camphorquinone, anthraquinones, benzoyl phosphorus compounds, acridines, and triazenes. Examples include 2,2'-diethoxyacetophenone, 2,2'-dibutoxy acetophenone, 2,2'-dimethoxy-α-phenyl acetophenone, 4-chloroacetophenone, 2-hydroxy-2-methyl propiophenone, benzophenone, 4,4'-dichlorobenzophenone, 4,4'-(diethylamino) benzophenone, 3,3'-dimethyl-2-methoxy-benzophenone, 2,2'-dichloro-4-phenoxy acetophenone, 2-methyl-1-(4-(methylthio) phenyl)-2-morpholino-1-one, benzoyl benzoic acid, benzoyl benzoic acid methyl, 4-phenyl benzophenone, anthraquinone, iso-butyl benzoin ether, mixtures of butyl isomers of benzoin butyl ether, benzoin, benzoin methyl ether, benzoin ethyl ether, benzoin isopropyl ether, thioxanthone, 2-methyl thioxanthone, isopropyl thioxanthone, 2,4-diethyl thioxanthone, 2,4-diisopropyl thioxanthone, 9-phenyl acridine, phenylbis(2,4,6-trimethylbenzoyl)phosphine oxide, diphenyl(2,4,6-trimethylbenzoyl)phosphine oxide, 2-phenyl-4,6-bis(trichloromethyl)-s-triazine, 2-(3',4'-dimethoxy-styryl)-4,6-bis (trichloromethyl)-s-triazine, 2-(4'-methoxynaphthyl)-4,6-bis(trichloromethyl)-s-triazine, and 2-(p-methoxy methoxyphenyl)-4,6-bis(trichloromethyl)-s-triazine. The ultraviolet light photoinitiator can be present in the photocurable composition in an amount of 0.01 to 15 wt %, or 0.2 to 10 wt %, wherein each weight percent is based on the total weight of the photoreactive oligomer component, the photoreactive monomer component, and the photoinitiator composition, and totals 100 weight percent.

The photoinitiation composition can further optionally comprise an ultraviolet light-absorbing agent. The ultraviolet light-absorbing agent can include a hydroxy benzophenone, such as 2,4-dihydroxy benzophenone, 2,3,4-trihydroxy benzophenone, 2,2'-dihydroxy-4-methoxy benzophenone, 2-hydroxy-4-methoxy benzophenone, or others. A combination thereof can be used. The ultraviolet light-absorbing agent is present in an amount of 0.1 to 10 wt %, 0.1 to 5 wt %, or 0.3 to 3 wt %, wherein each weight percent is based on the total weight of the photoreactive oligomer component, the photoreactive monomer component, and the photoinitiator composition, and totals 100 weight percent.

The photoinitiation composition optionally still further comprises a scintillating agent. The scintillating agents can absorb high-energy invisible radiant energy and emit, in response to excitation by the absorbed energy, radiant energy of a lower level and longer wavelength than the exciting energy but still of a shorter wavelength and higher energy level than visible light. The scintillating agent can comprise a polycyclic aromatic compound. The scintillating agent can include 2,5-diphenyloxazole, 1,4-bis-2-(5-phenyloxazolyl)-benzene), terphenyl, 1,1,4,4-tetraphenylbutadiene 2,5-bis(5-tert-butyl-benzoxazol-2-yl)thiophene, or a combination thereof. In another example, the scintillating agent can include a lanthanide chelate, such as a tris complex of 2,6-pyridine dicarboxylic acid (dipicolinic acid, DPA), e.g., $Li_3[Eu(DPA)_3]$. Lanthanides that can be used in the chelate include europium (Eu), samarium (Sm), dysprosium (Dy), terbium (Tb), or a combination thereof. The scintillating agent can be a spin orbit coupling enhanced scintillating material, such as iridium-tris[2-(4-tosyl)pyridinato-$NC^2$], or a pyrazolate-bridged cyclometalated platinum (II) complex. A combination thereof can be used. The scintillating agent can be present in an amount of 0.01 to 2 wt %, 0.05 to 1 wt %, or 0.1 to 1 wt %, wherein each weight percent is based on the total weight of the photoreactive oligomer component, the photoreactive monomer component, and the photoinitiator composition, and totals 100 weight percent.

The photocurable composition can further comprise an additive composition, wherein the additive composition can comprise a flame retardant, a heat stabilizer, an antioxidant, a plasticizer, a polymerization inhibitor, an ultraviolet light stabilizer, or a viscosity modifier. A combination comprising at least one of the foregoing can be used.

The heat stabilizer or antioxidant can be a phosphite such as 2-ethylhexyl diphenyl phosphite, diphenyl isodecyl phosphite, tri-isodecyl phosphite, distyryl pentaerythritol diphosphite, tris(2,4-di-tert-butylphenyl) phosphite, or bis (2,4-di-tetra-t-butylphenyl) pentaerythritol diphosphite; a thio propionate or propionate such as dilauryl thiodipropionate, tetrakis [methylene-3-(3,5-di-tetra-butyl-4-hydroxyphenyl) propionate], isotridecyl-3-(3,5-di-tetra-butyl-4-hydroxyphenyl) propionate, isooctyl-3-(3,5-di-tetra-butyl-4-hydroxyphenyl) propionate, thiodiethylene bis[3-(3,5-di-tetra-tert-butyl-4-hydroxyphenyl) propionate, hexamethylene bis [3-(3,5-di-tetra-butyl-4-hydroxyphenyl) propionate]; a hindered aryl compound such as 4,4' thiobis (6-tetra-butyl-m-cresol), 4,6-bis (octyl thiomethyl)-o-cresol, 1,3,5-trimethyl-2,4,6-tris (3,5-di-tert-butyl-4-hydroxybenzyl) benzene, tris(3,5-di-tert-butyl-4-hydroxybenzyl) isocyanurate, octadecyl-3-(3,5di-tert-butyl-4-hydroxyphenyl) propionate, triethylene glycol bis(3-tert-butyl-4-hydroxy-5-methylphenyl) propionate, or 2,2-methylenebis(4 methyl-6-(1-methylcyclohexyl)-phenol); a triazole such as 2-(2'-hydroxy-5'-methylphenyl benzotriazole, 2-(2'-hydroxy-3',5'-di-tetra-butyl-phenyl) benzotriazole, 2-(2'-hydroxy-3',5'-di-tetra-butyl-phenyl)-5-chlorobenzotriazole, 2-(2'-hydroxy-3',5'-di-tetra-amylphenyl) benzotriazole, 2-(2H-benzotriazol-2-yl)-4-(1,1,3,3-tetramethylbutyl) phenol, 2-[2-hydroxy-3,5-di (1,1-dimethylbenzyl) phenyl]-2H-benzotriazole, or bis[2-hydroxy-5-tetrahydro-octyl 3-(benzotriazol-2-yl) phenyl] methane; a benzoate such as hexadecyl 3,5-di-tetra-butyl-4-hydroxybenzoate; a triazine such as 2-[4-[(2-hydroxy-3-dodecyl-oxy-propyl)oxy]-2 hydroxyphenyl]-4,6-bis (2,4-dimethylphenyl)-1,3,5-triazine, 2-[4-(4,6-bis-biphenyl-4-yl-

[1,3,5] triazin-2-yl)-3-hydroxy-phenoxy] propionic acid 6-methyl-heptyl ester, or 2,4-bis[2-hydroxy-4-butoxyphenyl]-6-(2,4-dimethylphenyl)-1,3,5-triazine, and the like. A combination of different compounds can be used.

In some aspect the photocurable resin composition further comprises a thermally curable component and a thermal cure initiator to initiate thermal cure. Inclusion of a thermally curable component allows multi-stage curing of the polymer structure. Examples of additional thermally curable compounds that optionally can be used in addition to the photocurable oligomers and monomers can include 1,3-dicyanatobenzene, 1,4-dicyanatobenzene, 1,3,5-tricyanatobenzene, 1,3-dicyanatonaphthalene, 1,3,6-tricyanatoaphthalene, 2,2'-dicyanatobiphenyl, bis(4-cyanatophenyl) methane, 4-chloro-1,3-dicyanatobenzene, cyanated novolacs produced by reacting a novolac with cyanogen halide, and cyanated bisphenol polycarbonate oligomers produced by reacting a bisphenol polycarbonate oligomer with cyanogen halide. A combination of two or more thermally curable compounds can be used. When present, the thermally curable components can be used in an amount of 5 to 85 wt %, 10 to 85 wt %, or 10 to 75 wt %, or 30 to 65 wt %, wherein each weight percent is based on the total weight of the photocurable composition, the photoreactive oligomer component, the photoreactive monomer component, the photoinitiator composition, the thermally curable components, and the thermal cure initiator, and totals 100 weight percent.

Examples of thermal cure initiators include peroxides, certain nucleophilic catalysts, or certain metal coordination catalysts as is known in the art. When present, the thermal cure initiator can be used in an amount of 0.01 to 2 wt %, 0.05 to 1 wt %, or 0.1 to 1 wt %, wherein each weight percent is based on the total weight of the photocurable composition, photoreactive oligomer component, the photoreactive monomer component, the photoinitiator composition, the thermally curable components, and the thermal cure initiator, and totals 100 weight percent.

As stated above, the photocurable compositions provide photocured polymer materials having a desirable combination of electrical and mechanical properties.

Dielectric loss (Df, also referred to as the dissipation factor or the loss tangent of a material) quantifies a dielectric material's inherent dissipation of electromagnetic energy. The photocured polymer materials can have a dielectric loss factor of less than 0.01, or less than 0.008, or less than 0.006, or less than 0.004 each measured at a frequency of 10 GHz. For example, the photocured polymer components can have a dielectric loss factor of 0.0001 to 0.01, or 0.0001 to 0.008, or 0.0001 to 0.006, or 0.0001 to 0.004, each measured at a frequency of 10 GHz.

Relative permittivity (Dk, also referred to as the dielectric constant of a material) is the measure of resistance that is encountered when forming an electric field in a medium relative to that of a vacuum. A permittivity of the photocured composition can be at least 2, or at least 2.1. The permittivity of the photocured composition can be less than 18, or less than 14, or less than 10. For example, the permittivity of the photocured composition can be 2 to 18, 2 to 14, or 2 to 12. Dielectric loss and relative permittivity can each be measured by split-post dielectric resonator testing at various frequencies, for example 10 GHz, at a temperature of 23 to 25° C.

In a specific aspect, the photocurable compositions can include 35 to 85 wt %, preferably 35 to 65 wt %, of the photoreactive oligomer component, which includes a urethane methacrylate-derivatized polybutadiene oligomer; 15 to 65 wt %, preferably 45 to 65 wt %, of the photoreactive monomer component, which includes ethylene glycol dimethacrylate, trimethylolpropane trimethacrylate, and 2-ethylhexyl acrylate; and 0.1 to 5 wt % of the photoinitiation composition, wherein each weight percent is based on the total weight of the photoreactive oligomer component, the photoreactive monomer component, and the photoinitiator composition, and totals 100 weight percent. The photocurable composition can include 10 to 40 wt % of the ethylene glycol dimethacrylate, 5 to 20 wt % of the trimethylolpropane trimethacrylate, and 5 to 20 wt % of the 2-ethylhexyl acrylate, based on the total weight of the photoreactive oligomer component, the photoreactive monomer component, and the photoinitiator composition, and totals 100 wt %. In this aspect, the photocurable composition further includes 10 to 50 vol %, or 10 to 40 vol % of a particulate filler, preferably which includes alumina and barium nonatitanate, based on the total volume of the photocurable composition including the filler. The photocurable composition is SLS-printable as described below. The photocured material can have a dielectric constant of 4.7 to 5.1 a dielectric loss of less than 0.004 at 10 GHz.

A method for forming the photocurable composition includes combining the various components of the composition. The components can be added in any suitable order and in a suitable amount. The method of combining is not specifically limited, and can comprise stirring, shaking, milling, or ultrasonic mixing. If transported or stored, the photocurable composition is preferably protected from light and or heat. The photocurable composition at a thickness of 0.020 inch (0.05 cm) can have a cure time of 6 to 30 seconds, or 10 to 25 seconds, or 15 seconds at 22° C. under SLA manufacturing conditions as described below. "Curable" and "curing" as used herein includes polymerizable and crosslinkable, and polymerizing and crosslinking.

The photocurable composition is used for manufacture of three-dimensional polymer objects by SLA. In these methods, successive thin layers of a photopolymerizable composition are selectively photopolymerized using a light source. This process has been described, for example, in U.S. Pat. Nos. 4,575,330, 4,929,402, 5,104,592, 5,184,307, 5,192, 559, 5,234,636, 5,236,637, and 5,273,691. In a preferred aspect, the method is a stereolithographic method as described, for example, in U.S. Pat. No. 9,205,601.

Approaches to SLA include direct/laser writing and mask-based writing using digital projection. In direct/laser writing a stage on which the polymer material is formed is located just below a surface of a volume of a curable liquid resin composition for the formation of a polymer. A single light source (e.g., a laser) moves along the surface of the curable composition, row by row, until completely curing the desired layer. To initiate the following layer, the stage sinks lower into the volume of the curable liquid resin composition until a new layer of the curable composition covers the surface and the curing process repeats. In between layers, a blade loaded with the curable liquid resin composition levels the surface of the resin to ensure a uniform layer of liquid prior to another round of light exposure. This procedure repeats until the curable liquid resin composition is printed to form the 3D structure.

In another approach, mask-based writing using digital projection, the stage is submerged a defined distance into the volume of the liquid, curable composition. The volume is located in a bath having an optically clear bottom. Next, the light source is guided to the stage in a pattern to polymerize the curable composition between the light source and the stage. In the digital projection method, a digital mirror device allows an entire layer of a given pattern to be cured simultaneously. The stage can then be raised by a defined distance, and another layer can be cured. This procedure repeats until the curable liquid resin composition is printed to form the 3D structure.

After the component is manufactured, the 3D-printed component can optionally be post-cured, e.g., further cross-linked. This can be accomplished by further exposure to UV radiation. If a thermosetting resin composition is included in the photocurable composition, the post-cure can be thermal, for example by exposure to heat in an oven.

The resulting polymeric structure can have any suitable configuration or shape. The resulting polymeric structure formed by SLA is a unified body that can be solid or porous. In an aspect, the body is porous, such that air contributes to the overall dielectric constant of the body. As discussed above, use of a higher dielectric constant filler allows the manufacture of such structures having the desired Dk. In addition, the dielectric loss can be very low, depending on the loss of the material as well as the porosity of the material. For example, a polymeric structure can be have a dielectric loss factor of less than 0.01, or less than 0.008, or less than 0.006, or less than 0.004, or less than 0.002, or less than 0.001, each measured at a frequency of 10 GHz. For example, the photocured polymer components can have a dielectric loss factor of 0.0001 to 0.01, or 0.0001 to 0.008, or 0.0001 to 0.006, or e or 0.0001 to 0.004, or 0.0001 to 0.002, or 0.0001 to 0.001, each measured at a frequency of 10 GHz.

In an aspect, the polymer structure is disposed on, or directly contacts an electrically conductive layer. In some aspects, at least two alternating polymer structures or at least two alternating layers of the electrically conductive layer are present to form a stack. Useful electrically conductive materials for the conductive layer include, for example, stainless steel, copper, gold, silver, aluminum, zinc, tin, lead, a transition metal, or a combination thereof. There are no particular limitations regarding the thickness of the conductive layer, nor are there any limitations as to the shape, size, or texture of the surface of the electrically conductive layer. The conductive layer can have a thickness of 1 to 2000 micrometers, or 10 to 1000 micrometers. When two or more conductive layers are present, the thickness of each layer can be the same or different. The conductive layer can comprise a copper layer. Suitable conductive layers include a thin layer of a conductive metal such as a copper foil presently used in the formation of circuits, for example, electrodeposited copper foils.

The conductive layer can be contacted with the polymer structure by placing the conductive layer on the platform used for the additive manufacturing process, and printing onto the conductive layer. Alternatively, the polymer material can be contacted with the conductive layer by direct laser structuring, or by adhesion. Other methods known in the art can be used to apply the conductive layer where permitted by the particular materials and form of the polymer materials, for example, electrodeposition, chemical vapor deposition, and the like.

For example, the conductive layer can be applied by laser direct structuring. Here, the 3D-printed polymer material can comprise a laser direct structuring additive, and the laser direct structuring can comprise using a laser to irradiate the surface of the substrate, forming a track of the laser direct structuring additive, and applying a conductive metal to the track. The laser direct structuring additive can comprise a metal oxide particle (such as titanium oxide and copper chromium oxide). The laser direct structuring additive can comprise a spinel-based inorganic metal oxide particle, such as spinel copper. The metal oxide particle can be coated, for example, with a composition comprising tin and antimony (for example, 50 to 99 wt % of tin and 1 to 50 wt % of antimony, based on the total weight of the coating). The laser direct structuring additive can comprise 2 to 20 parts of the additive based on 100 parts of the respective composition. The irradiating can be performed with a YAG laser having a wavelength of 1,064 nanometers under an output power of 10 Watts, a frequency of 80 kilohertz (kHz), and a rate of 3 meters per second. The conductive metal can be applied using a plating process in an electroless plating bath comprising, for example, copper.

The conductive layer can be adhesively contacted. In an aspect, the polymer structure can first be formed by photopolymerization. When a thermal cure agent is present in the polymer material composition, the polymer structure and the electrically conductive layer can be contacted and adhered by thermal cure of the polymer material in the polymer structure. This technique allows "B-staging" of the polymer structures. It is particularly useful where multilayer structures are desired. For example, a plurality of layers of the polymer structures can be manufactured (B-staged); a stack of alternating polymer layers and conductive layers can be made; and then the stack can be thermally cured to adhere the layers. In other aspects, a polymer structure can be manufactured (B-staged) in the form of a flat sheet; a conductive layer can be contacted with the flat sheet; the layers can be rolled to provide a cylinder of alternating polymer sheet and conductive layer; and the roll can be thermally cured to adhere the layers.

Alternatively, or in addition, an adhesion layer can be disposed between one or more conductive layers and the polymer material.

Polymer structures useful at various radiofrequencies, including 3G, 4G, and 5G applications can be manufactured. The polymer structures can be used as or in an electronic device, for example as an impedance-matching layer, a dielectric waveguide, a lens, a reflect array, an antenna matching structure, a superstrate, a coupler, a divider, a radome, or a dielectric antenna (including dielectric resonant antennas).

The compositions and methods described herein allow fast, efficient manufacture of materials having very low loss, in a variety of configurations and a variety of shapes, including geometrically complex parts. It also allows for the ability to create structures with a gradient dielectric constant throughout all dimensions of a part, with one material and process. The compositions and methods have many other advantages, including dramatically reducing the time from design to prototyping to commercial product. Since no tooling is needed, design changes can be made quickly. Minimal energy is used, compared to injection molding or other molding processes. Use of additive manufacturing can also decrease the amount of waste and raw materials. The compositions and methods can further reduce the parts inventory for a business since parts can be quickly made on-demand and on-site.

EXAMPLES

Materials

The materials shown in the below Table were used in the Examples.

| Material | CAS No. | Trade Name, Source |
|---|---|---|
| Isobornyl methacrylate | 7534-94-3 | SR423A, Sartomer |
| Isobornyl acrylate | 5888-33-5 | SR506C, Sartomer |
| Ethylene glycol dimethacrylate | 97-90-5 | SR206, Sartomer |
| 1,6-Hexanediol diacrylate | 13048-33-4 | SR238B, Sartomer |
| Trimethylolpropane trimethacrylate | 3290-92-4 | SR351H, Sartomer |
| Trimethylolpropane triacrylate | 15625-89-5 | SR350, Sartomer |
| 1,6-Hexanediol dimethacrylate | 6606-59-3 | SR239, Sartomer |
| 2-Ethylhexyl methacrylate | 688-84-6 | Norsocryl 2EHA, Arkema |
| 2-Ethylhexyl acrylate | 103-11-7 | 2-EHMA F, BASF |
| 1,3 Butanediol dimethacrylate | 1189-08-8 | SR214A, Sartomer |
| Urethane methacrylate-derivatized polybutadiene oligomer (Mn = 2,500 g/mol) | 68987-46-2 | TE-2000, Nippon Soda Co., Ltd |
| Urethane methacrylate-derivatized polybutadiene oligomer (Mn = 2,400 g/mol) (1,3-Butadiene, homopolymer, hydrogenated, 2-hydroxyethyl-terminated, bis[N-[2-methyl-5-[[[2-[(1-oxo-2-propen-1-yl)oxy]ethoxy]carbonyl]amino]phenyl]carbamates]) | 1345023-61-1 | TEAI-1000, Nippon Soda Co., Ltd. |

Test Methods

Viscosity was determined using a Brookfield viscometer at 23° C.

Dielectric loss (Df) and dielectric constant (Dk) were determined by split-post dielectric resonator (SPDR) testing. This method is described, for example, in Krupka J., Gregory A. P., Rochard O. C., Clarke R. N., Riddle B., Baker-Jarvis J., "Uncertainty of Complex Permittivity Measurement by Split-Post Dielectric Resonator Techniques," Journal of the European Ceramic Society, Number 10, pp. 2673-2676, 2001; and in Krupka, J., Geyer, R. G., Baker-Jarvis, J., Ceremuga, J., "Measurements of the complex permittivity of microwave circuit board substrates using split dielectric resonator and reentrant cavity techniques", Seventh International Conference on Dielectric Materials, Measurements and Applications, (Conf. Publ. No. 430), pp. 21-24, September 1996. Testing was conducted at a temperature of 23° C.

Example 1

Preparation of Polybutadiene Urethane Acrylate Photocurable Compositions (Unfilled)

An array of photocurable compositions were prepared using urethane polybutadiene methacrylate resin (TE-2000) as the photoreactive oligomer with the photoreactive monomers isobornyl methacrylate, isobornyl acrylate, ethylene glycol dimethacrylate, 1,6-hexanediol diacrylate, trimethylolpropane trimethacrylate, trimethylolpropane triacrylate, 1,6-hexanediol dimethacrylate, 2-ethylhexyl acrylate, 2-ethylhexyl methacrylate, hydroxypropyl methacrylate, and 1,3-butanediol dimethacrylate in amounts of 10 to 90 wt %, based on a total weight of the composition. Each composition also included 1 wt % of photoinitiator BAPO (phenylbis (2,4,6-trimethylbenzoyl)phosphine oxide), based on the total weight of the composition.

To prepare each composition, the oligomer was heated to 60° C. to reduce viscosity sufficiently to allow measuring and dispensing the material. The oligomer, monomers, and photoinitiator were mixed in a container via a LabRam II acoustic mixer from Resodyn Acoustic Mixers for 5 minutes at 50 g acceleration. The composition was allowed to cool to room temperature, and then coated into a thin film and exposed to UV radiation in a Dymax 5000-EC UV flood oven with a mercury bulb. The solid cured films were suitable to use in a split-post dielectric resonator test to measure dielectric constant and loss.

Viscosity, dielectric loss, cure time, and permittivity evaluation are provided in Tables 1 to 5.

Table 1 illustrates the effect of different monomers on loss on photocured polymers prepared using polybutadiene methacrylate resin (TE-2000) as the photoreactive oligomer and each listed monomer in an amount of 60 wt %, based on the total weight of the compositions.

TABLE 1

| Monomer | Methacryl/Acryl | Funct. No.* | Mol Mass, g/mol | Df at 10 GHz |
|---|---|---|---|---|
| Isobornyl methacrylate | Methacryl | 1 | 222.3 | 0.0088 |
| Isobornyl acrylate | Acryl | 1 | 208.3 | 0.0118 |
| Ethylene glycol dimethacrylate | Methacryl | 2 | 198.2 | 0.0069 |
| 1,6-Hexanediol diacrylate | Acryl | 2 | 226.3 | 0.0174 |
| Trimethylolpropane trimethacrylate | Methacryl | 3 | 338.4 | 0.0079 |
| Trimethylolpropane triacrylate | Acryl | 3 | 296.3 | 0.0141 |
| 1,6-Hexanediol dimethacrylate | Methacryl | 2 | 254.3 | 0.0078 |
| 2-Ethylhexyl methacrylate | Acryl | 1 | 198.3 | NS |
| 2-Ethylhexyl acrylate | Acryl | 1 | 184.3 | NS |
| 1,3 Butanediol dimethacrylate | Methacryl | 2 | 226.3 | NS |

*Number of (meth)acrylate groups
NS-No sample could be made

As can be seen in Table 1, loss (Df) is generally higher when the monomer contained acrylate versus methacrylate groups. No trend was observed based on functionality of the monomer, or on molecular mass.

Table 2 shows the effect of amount and type of monomer on viscosity of photocurable polymer compositions prepared using polybutadiene methacrylate resin (TE-2000) as the photoreactive oligomer. The amount of each listed monomer is based on the total weight of the photocurable compositions. In Table 2, "X" represents a composition having too high a viscosity to be SLA printable. A viscosity in the range of 1 to 250 cP is too liquid for efficient SLA printing. A viscosity in the range of 250 to 10,000 cP is efficiently SLA-printable.

TABLE 2

| | Viscosity (Centipoise) | | | | | | | | |
|---|---|---|---|---|---|---|---|---|---|
| | Monomer, wt. % | | | | | | | | |
| Monomer | 10 | 20 | 30 | 40 | 50 | 60 | 70 | 80 | 90 |
| Isobornyl methacrylate | X | X | X | 14,000 | 1,900 | 575 | 300 | 75 | 50 |
| Isobornyl acrylate | X | X | X | 6,400 | 1,000 | 600 | 200 | 60 | 30 |

TABLE 2-continued

| | Viscosity (Centipoise) | | | | | | | | |
|---|---|---|---|---|---|---|---|---|---|
| | Monomer, wt. % | | | | | | | | |
| Monomer | 10 | 20 | 30 | 40 | 50 | 60 | 70 | 80 | 90 |
| Ethylene glycol dimethacrylate | X | X | 14,200 | 2,000 | 425 | 125 | 50 | 40 | 25 |
| 1,6-Hexanediol diacrylate | X | X | 16,800 | 2,700 | 800 | 250 | 150 | 60 | 40 |
| Trimethylolpropane trimethacrylate | X | X | X | X | 5,700 | 2,400 | 600 | 350 | 120 |
| Trimethylolpropane triacrylate | X | X | X | X | 6,800 | 2,300 | 900 | 275 | 225 |
| 1,6-Hexanediol dimethacrylate | X | 12,400 | 7,200 | 2,600 | 600 | 200 | 100 | 50 | 20 |
| 2-Ethylhexyl acrylate | 12,800 | 4,800 | 2,400 | 800 | 250 | 100 | 40 | 20 | 16 |
| 2-Ethylhexyl methacrylate | 12,000 | 7,600 | 3,100 | 950 | 350 | 100 | 40 | 20 | 16 |
| Hydroxypropyl methacrylate | X | 21,600 | 12,800 | 1,500 | 950 | 700 | 200 | | |
| 1,3-Butanediol dimethacrylate | X | X | 4,800 | 1,200 | 500 | 250 | 100 | 30 | 10 |

As can be seen from Table 2, good viscosities with this composition (without filler) are generally attained when the monomer component is present in the range of 30 to 70 weight percent based on total weight of monomer and oligomer. Each preferred amount varies with each monomer, however.

Table 3 shows the effect of amount and type of monomer on dielectric loss (Df) of photocured polymers prepared using polybutadiene methacrylate resin (TE-2000) as the photoreactive oligomer. The amount of each listed monomer is based on the total weight of the photocurable compositions. In Table 3, "X" represents a composition having too high a viscosity to be SLA printable, "~" represents a composition that cures too slowly for SLA printing (resulting in a polymer to "sticky" to be useful as an electronic device), and "-" represents a composition having too low a viscosity to be SLA printable.

TABLE 3

| | Dielectric Loss (Df) | | | | | | | | |
|---|---|---|---|---|---|---|---|---|---|
| | Monomer, wt. % | | | | | | | | |
| Monomer | 10 | 20 | 30 | 40 | 50 | 60 | 70 | 80 | 90 |
| Isobornyl methacrylate | X | X | X | X | 0.0154 | 0.0088 | 0.0067 | — | — |
| Isobornyl acrylate | X | X | X | X | 0.0119 | 0.0118 | 0.0073 | — | — |
| Ethylene glycol dimethacrylate | X | X | X | 0.0072 | 0.0071 | 0.0069 | — | — | — |
| 1,6-Hexanediol diacrylate | X | X | X | 0.0159 | 0.0163 | 0.0174 | — | — | — |
| Trimethylolpropane trimethacrylate | X | X | X | X | X | 0.0079 | 0.0122 | — | — |
| Trimethylolpropane triacrylate | X | X | X | X | X | 0.0141 | 0.0158 | — | — |
| 1,6-Hexanediol dimethacrylate | X | X | X | ~ | 0.0096 | 0.0078 | — | — | — |
| 2-Ethylhexyl acrylate | X | X | ~ | ~ | 0.0080 | ~ | — | — | — |
| 2-Ethylhexyl methacrylate | X | X | X | ~ | ~ | ~ | — | — | — |
| Hydroxypropyl methacrylate | X | X | X | 0.0166 | 0.0234 | 0.0182 | — | — | — |
| 1,3-Butanediol dimethacrylate | X | X | X | 0.0066 | 0.0060 | ~ | — | — | — |

As shown in Table 3, the amount of each monomer that provides optimal viscosity and dielectric loss varies for each monomer.

Table 4 shows the effect of amount and type of monomer on cure time of photocurable compositions prepared using polybutadiene methacrylate resin (TE-2000) as the photoreactive oligomer. The amount of each listed monomer is based on the total weight of the photocurable compositions. In Table 4, "X" represents a composition having too high a viscosity to be SLA printable and "-" represents a composition having too low a viscosity to be SLA printable.

TABLE 4

| | Cure time (seconds) | | | | | | | | |
|---|---|---|---|---|---|---|---|---|---|
| | Monomer (wt %) | | | | | | | | |
| Monomer | 10 | 20 | 30 | 40 | 50 | 60 | 70 | 80 | 90 |
| Isobornyl methacrylate | X | X | X | X | 30* | 9 | 15 | — | — |
| Isobornyl acrylate | X | X | X | X | | | 15 | — | — |
| Ethylene glycol dimethacrylate | X | X | X | 12 | 12 | 15 | — | — | — |
| 1,6-Hexanediol diacrylate | X | X | X | 9 | | | — | — | — |

TABLE 4-continued

| | Cure time (seconds) | | | | | | | | |
|---|---|---|---|---|---|---|---|---|---|
| | Monomer (wt %) | | | | | | | | |
| Monomer | 10 | 20 | 30 | 40 | 50 | 60 | 70 | 80 | 90 |
| Trimethylolpropane trimethacrylate | X | X | X | X | X | 9 | — | — | — |
| Trimethylolpropane triacrylate | X | X | X | X | X | 15 | 6 | — | — |
| 1,6-Hexanediol dimethacrylate | X | X | X | 15 | 9 | 6 | — | — | — |
| 2-Ethylhexyl acrylate | X | X | 25* | 25* | 9 | 25* | — | — | — |
| 2-Ethylhexyl methacrylate | X | X | X | 30* | 30* | 30* | — | — | — |
| Hydroxypropyl methacrylate | X | X | X | 9 | 15 | 18* | — | — | — |

*Composition cures too slowly for SLA printing, resulting in a "sticky" polymer not useful as an electronic device.

As shown in Table 4, the amount of each monomer that provides optimal viscosity and cure time varies for each monomer.

Table 5 shows the effect of amount and type of monomer on the dielectric constant of photocured polymers prepared using polybutadiene methacrylate resin (TE-2000) as the photoreactive oligomer. The amount of each listed monomer is based on the total weight of the photocurable compositions. In Table 4, "X" represents a composition having too high a viscosity to be SLA printable and "-" represents a composition having too low a viscosity to be SLA printable.

TABLE 5

| | Dielectric constant | | | | | | | | |
|---|---|---|---|---|---|---|---|---|---|
| | Monomer, wt. % | | | | | | | | |
| Monomer | 10 | 20 | 30 | 40 | 50 | 60 | 70 | 80 | 90 |
| Isobornyl methacrylate | X | X | X | X | 2.0882 | 2.4512 | 2.3860 | — | — |
| Isobornyl acrylate | X | X | X | X | 2.1668 | 2.3858 | 2.4634 | — | — |
| Ethylene glycol dimethacrylate | X | X | X | X | 2.7825 | 2.1551 | — | — | — |
| 1,6-Hexanediol diacrylate | X | X | X | X | 2.4395 | 2.3719 | — | — | — |
| Trimethylolpropane trimethacrylate | X | X | X | X | X | 2.2263 | 2.2270 | — | — |
| Trimethylolpropane triacrylate | X | X | X | X | X | 2.5459 | 2.6927 | — | — |
| 1,6-Hexanediol dimethacrylate | X | X | X | X | 2.2329 | 2.4382 | — | — | — |
| 2-Ethylhexyl acrylate | X | X | ~ | ~ | 2.3336 | ~ | — | — | — |
| 2-Ethylhexyl methacrylate | X | X | ~ | ~ | ~ | ~ | — | — | — |
| Hydroxypropyl methacrylate | X | X | X | 2.3058 | 2.2916 | 2.2217 | — | — | — |
| 1,3-Butanediol dimethacrylate | X | X | X | 2.0771 | 2.0574 | ~ | — | — | — |

As shown in Table 5, with no filler present, SLA-printable compositions can be obtained having a dielectric constant in the range of 2.0771 to 2.7825.

Example 2

A composition including 60 wt % TE-2000 oligomer, 20 wt % 2-ethylhexyl acrylate, and 20 wt % ethylene glycol dimethacrylate was prepared with 1 part per hundred (pph) of BAPO photoinitiator added. Without filler the material had a viscosity of 500 centipoise at 23° C. by Brookfield viscometer, a dielectric constant of 2.3 and dielectric loss of 0.0064 at 10 GHz.

A formulation with silica filler was also prepared by further addition of 30 vol % of silica (FB-8S from Denka) treated with approximately 1 wt % methacryloxypropyltrimethoxysilane and subsequently mixing in a LabRam II acoustic mixing system for 5 minutes at 50 g acceleration. The silica-filled composition measured a viscosity of 3,000 cP at 23° C. via a Brookfield viscometer, and was cured with exposure to UV radiation in a Dymax 5000-EC UV flood oven with a mercury bulb. The solid cured films were suitable to use in a split-post dielectric resonator test to measure dielectric constant and loss. The material measured a dielectric constant of 2.5 and loss of 0.0046 at 10 GHz.

A formulation with alumina filler was also prepared by addition of 30 vol % of alumina (DAW-10 from Denka) treated with approximately 1 wt % methacryloxypropyltrimethoxysilane. The alumina filled composition had a viscosity of 4500 centipoise at 23° C. by Brookfield viscometer, a dielectric constant of 3.4, and dielectric loss of 0.0041 at 10 GHz.

Example 3

A composition including 40 wt % of a urethane methacrylate polybutadiene oligomer (TEAI-1000), 30 wt % isobornyl methacrylate, 20 wt % ethylene glycol dimethacrylate, and 10 percent trimethylolpropane trimethacrylate was prepared with 1 part per hundred by weight (pph) of BAPO photoinitiator and 0.1 pph of scintillating agent 2,5-bis(5-tert-butyl-2-benzoxazolyl)thiophene added. Subsequently, 18 vol % of alumina (DAW-10 from Denka) treated with approximately 1 wt % methacryloxypropylt-rimethoxysilane, and 19 vol % of barium nonatitanate (Trans-Tech) treated with approximately 1 wt % of oleyl titanate was added to the composition, each based on the total volume of the composition. The resulting photocured material had a dielectric constant of 4.9 and loss of 0.0035 at 10 GHz.

Example 4

A composition including 60 wt % of a urethane methacrylate polybutadiene oligomer (TEAI-1000), 15 wt % isobornyl methacrylate, 10 wt % ethylene glycol dimethacrylate, 10 wt % trimethylolpropane trimethacrylate, and 5 wt % 2-ethylhexyl acrylate was prepared with 1 pph of BAPO photoinitiator and 0.1 pph of scintillating agent 2,5-bis(5-tert-butyl-2-benzoxazolyl)thiophene added. Subsequently, 18 vol % of alumina (DAW-10 from Denka) treated with approximately 1 wt % methacryloxypropylt-rimethoxysilane, and 19 vol % of barium nonatitanate (Trans-Tech) treated with approximately 1 wt % of oleyl titanate were added to the composition, each based on the total volume of the composition. The resulting photocured material measured a dielectric constant of 4.9 and loss of 0.0039 at 10 GHz.

Example 5

Six samples A-F were formulated using a 50 wt % mixture of a urethane acrylic polybutadiene oligomer (TEAI-1000) with 50 wt % of a monomer component, then 1 wt %, based on the total weight of the oligomer and monomer BAPO photoinitiator was added. In Sample A, the monomer component is 100% trimethylolpropane trimethacrylate. The amount in subsequent Samples B-E decreases in 20 wt % increments, being replaced by trimethylolpropane triacrylate, until in Sample F where the monomer component is 100 wt % trimethylolpropane triacrylate. Dielectric constant and dielectric loss were tested for each sample at 5 and 10 GHz, and average results are shown in Table 6.

TABLE 6

| Sample | Monomer component, wt % | | 5 GHz SPDR | | 10 GHz SPDR | |
|---|---|---|---|---|---|---|
| | Methacrylate | Acrylate | Avg Dk | Avg DF | Avg Dk | Avg DF |
| A | 100 | 0 | 2.42 | 0.0050 | 2.57 | 0.0041 |
| B | 80 | 20 | 2.41 | 0.0051 | 2.38 | 0.0043 |
| C | 60 | 40 | 2.44 | 0.0060 | 2.44 | 0.0048 |
| D | 40 | 60 | 2.60 | 0.0073 | 2.46 | 0.0056 |
| E | 20 | 80 | 2.41 | 0.0062 | 2.55 | 0.0051 |
| F | 0 | 100 | 2.33 | 0.0074 | 2.49 | 0.0059 |

The data in Table 6 shows that an increase in acrylate content versus methacrylate content in the monomer component results in an increase in dielectric loss.

Set forth below are various non-limiting aspects of the disclosure.

Aspect 1. A photocurable composition for stereolithographic three-dimensional printing, wherein the photocurable composition comprises a photoreactive oligomer component comprising a hydrophobic oligomer comprising a photoreactive end group, a photoreactive monomer component comprising a photoreactive monomer having a photoreactive end group, and a photoinitiation composition comprising a photoinitiator; the photocurable composition has a viscosity of 250 to 10,000 centipoise at 22° C., determined using a Brookfield viscometer; and the photocured composition has a dielectric loss of less than 0.010, preferably less than 0.008, more preferably less than 0.006, most preferably less than 0.004, each determined by split-post dielectric resonator testing at 10 gigahertz at 23° C.

Aspect 2. The photocurable composition of Aspect 1, comprising 35 to 85 wt % of the photoreactive oligomer component, 15 to 65 wt % of the photoreactive monomer component, and 0.01 to 15 wt % of the photoinitiation composition, wherein each weight percent is based on the total weight of the photoreactive oligomer component, the photoreactive monomer component, and the photoinitiation composition, and totals 100 weight percent Aspect 3. The photocurable composition of Aspect 1 or Aspect 2, wherein the hydrophobic oligomer comprises a (meth)acrylate end group, preferably two or more methacrylate end groups.

Aspect 4. The photocurable composition of any one of Aspects 1 to 3, wherein the hydrophobic oligomer of photoreactive oligomer component is a (meth)acrylate-derivatized polyester, a (meth)acrylate-derivatized polyurethane, a (meth)acrylate urethane-derivatized polybutadiene oligomer, or a combination thereof.

Aspect 5. The photocurable composition of any one of Aspects 1 to 4, wherein the photoreactive oligomer component comprises a urethane (meth)acrylate-derivatized polybutadiene oligomer having a number average molecular weight of 500 to 5,000 g/mol.

Aspect 6. The photocurable composition of any one of Aspects 1 to 5, wherein the photoreactive monomer comprises a (meth)acrylate end group, preferably two or more methacrylate end groups.

Aspect 7. The photocurable composition of Aspect 6, wherein the photoreactive monomer component comprises at least 50% by weight, preferably at least 60% by weight, more preferably at least 70% by weight of a methacrylate-functional monomer.

Aspect 8. The photocurable composition of Aspect 6, wherein a monomer having an acrylate end group is present in an amount of 20 wt % or less, based on the total weight of the photoreactive oligomer component and the photoreactive monomer component.

Aspect 9. The photocurable composition of Aspect 7, wherein the photoreactive monomer component comprises a combination of ethylene glycol dimethacrylate, trimethylol propane trimethacrylate, and isobornyl methacrylate.

Aspect 10. The photocurable composition of any of Aspects 1 to 9, further comprising a particulate filler, in an amount of 5 to 60 vol %, preferably 10 to 60 vol %, more preferably 10 to 50 vol %, each based on the total volume of the photocurable composition.

Aspect 11. The photocurable composition of Aspect 10, wherein the particulate filler comprises silica, alumina, calcium titanate, strontium titanate, barium titanate, barium nonatitanate, boron nitride, aluminum nitride, or a combination thereof, preferably wherein the particulate filler or combination thereof has a dielectric constant of 5 or greater, more preferably wherein the particulate filler comprises alumina, barium nonatitanate, or combination thereof.

Aspect 12. The photocurable composition of any of Aspects 1 to 11, wherein the photoinitiation composition further comprises an ultraviolet light-absorbing agent, preferably in an amount of 0.01 to 10 wt %, based on the total weight of the photoreactive oligomer component, the photoreactive monomer component, and the photoinitiation composition and totals 100 weight percent.

Aspect 13. The photocurable composition of any of Aspects 1 to 12, wherein the photoinitiation composition further comprises scintillating agent, preferably in an amount of 0.01 to 2 wt %, based on the total weight of the photoreactive oligomer component, the photoreactive monomer component, and the photoinitiation composition and totals 100 weight percent.

Aspect 14. The photocurable composition of any one or more of Aspects 1 to 13, having a relative permittivity of 2 to 12 at 10 gigahertz.

Aspect 15 A three-dimensional structure comprising a photocured product of the composition of any one of Aspects 1 to 14.

Aspect 16. The photocurable composition of any of Aspects 1 to 13, having a dielectric loss of less than 0.004 at 10 GHz as determined by split-post dielectric resonator testing at 10 GHz at a temperature of 23° C.

Aspect 17. The three-dimensional structure of Aspect 15 or 16, wherein the structure is porous.

Aspect 18. An electronic device comprising the three-dimensional structure of any one of Aspects 15 to Aspect 17.

Aspect 19. The electronic device of Aspect 18, wherein the device is an impedance-matching layer, a dielectric waveguide, a lens, a reflective array, an antenna matching structure, a superstrate, a coupler, a divider, a radome, or a dielectric antenna.

Aspect 20. The electronic device of Aspect 19, wherein at least one electrical conductor is disposed on or in contact with the photocured product.

Aspect 21. A method of forming the photocurable composition of any one or more of Aspects 1 to 15, the method comprising combining the components of the composition.

Aspect 22. A stereolithographic method of manufacture of a three-dimensional polymer structure, the method comprising: providing a volume comprising the photocurable composition of any one or more of Aspects 1 to 15; irradiating a portion of the composition with activating radiation in a pattern to form a photocured layer of the structure; contacting the layer with the photocurable composition; irradiating the photocurable composition with activating radiation in a pattern to form a second photocured layer on the first layer; and repeating the contacting and irradiating to form the three-dimensional polymer structure.

Aspect 23. The method of Aspect 22, further comprising thermally curing the three-dimensional structure.

Aspect 24. A three-dimensional structure made by the method of Aspect 22 or Aspect 23, wherein the structure is porous.

Aspect 25. An electronic device comprising the three-dimensional structure of any one of Aspects 22 to 24.

Aspect 26. The electronic device of Aspect 23, wherein the device is an impedance-matching layer, a dielectric waveguide, a lens, a reflective array, an antenna matching structure, a superstrate, a coupler, a divider, a radome, or a dielectric antenna.

The compositions, methods, and articles can alternatively comprise, consist of, or consist essentially of, any appropriate materials, steps, or components herein disclosed. The compositions, methods, and articles can additionally, or alternatively, be formulated so as to be devoid, or substantially free, of any materials (or species), steps, or components, that are otherwise not necessary to the achievement of the function or objectives of the compositions, methods, and articles.

The terms "a" and "an" do not denote a limitation of quantity, but rather denote the presence of at least one of the referenced item. The term "or" means "and/or" unless clearly indicated otherwise by context. Reference throughout the specification to "an aspect," "another aspect," and "some aspects," means that a particular element (e.g., feature, structure, step, or characteristic) described in connection with the aspect is included in at least one aspect described herein and may or may not be present in other aspects. In addition, it is to be understood that the described elements can be combined in any suitable manner in the various aspects. The term "combination" is inclusive of blends, mixtures, alloys, reaction products, and the like. "At least one of" means that the list is inclusive of each element individually, as well as combinations of two or more elements of the list, and combinations of at least one element of the list with like elements not named. Similarly, "a combination thereof" is open, and can include at least one of the named elements, optionally together with a like or equivalent element not named.

The endpoints of all ranges directed to the same component or property are inclusive of the endpoints, are independently combinable, and include all intermediate points and ranges. For example, ranges of "up to 25 wt %, or 5 to 20 wt %" is inclusive of the endpoints and all intermediate values of the ranges of "5 to 25 wt %," such as 10 to 23 wt %, and the like.

When an element such as a layer, film, region, or substrate is referred to "contacting" or as being "on" another element, it can be directly contacting or directly on the other element or intervening elements can also be present. In contrast, when an element is referred to as "directly contacting" or as being "directly on" another element, there are no intervening elements present.

Unless specified to the contrary herein, all test standards are the most recent standard in effect as of the filing date of this application, or, if priority is claimed, the filing date of the earliest priority application in which the test standard appears.

Unless defined otherwise, technical and scientific terms used herein have the same meaning as is commonly understood by one of skill in the art to which this invention belongs. All cited patents, patent applications, and other references are incorporated herein by reference in their entirety. However, if a term in the present application contradicts or conflicts with a term in the incorporated reference, the term from the present application takes precedence over the conflicting term from the incorporated reference.

While particular embodiments have been described, alternatives, modifications, variations, improvements, and substantial equivalents that are or can be presently unforeseen can arise to applicants or others skilled in the art. Accordingly, the appended claims as filed and as they can be amended are intended to embrace all such alternatives, modifications variations, improvements, and substantial equivalents.

What is claimed is:

1. A photocurable composition for stereolithographic three-dimensional printing, wherein
the photocurable composition comprises
a photoreactive oligomer component comprising a hydrophobic oligomer comprising a photoreactive end group,
a photoreactive monomer component comprising a photoreactive monomer having a photoreactive end group, wherein the photoreactive monomer component comprises at least 50% by weight of a methacrylate-functional monomer, and
a photoinitiation composition comprising a photoinitiator;
the photocurable composition has a viscosity of 250 to 10,000 centipoise at 22° C., determined using a Brookfield viscometer; and
the photocured composition has a dielectric loss of less than 0.010 determined by split-post dielectric resonator testing at 10 gigahertz at 23° C.

2. The photocurable composition of claim 1, comprising 35 to 85 weight percent of the photoreactive oligomer component,
15 to 65 weight percent of the photoreactive monomer component, and
0.01 to 15 weight percent of the photoinitiation composition,
wherein each weight percent is based on the total weight of the photoreactive oligomer component, the photoreactive monomer component, and the photoinitiation composition, and totals 100 weight percent.

3. The photocurable composition of claim 1, wherein the hydrophobic oligomer of the photoreactive oligomer component comprises a (meth)acrylate end group.

4. The photocurable composition of claim 1, wherein the hydrophobic oligomer of the photoreactive oligomer component is a (meth)acrylate-derivatized polyester, a (meth)acrylate urethane-derivatized polybutadiene oligomer, or a combination thereof.

5. The photocurable composition of claim 1, wherein the hydrophobic oligomer of the photoreactive oligomer component comprises a urethane (meth)acrylate-derivatized polybutadiene oligomer having a number average molecular weight of 500 to 5,000 grams per mole.

6. The photocurable composition of claim 1, wherein the photoreactive monomer comprises a methacrylate end group.

7. The photocurable composition of claim 6, wherein a monomer having an acrylate end group is present in an amount of 20 weight percent or less, based on the total weight of the photoreactive oligomer component and the photoreactive monomer component.

8. The photocurable composition of claim 7,
wherein the photoreactive monomer component comprises a combination of ethylene glycol dimethacrylate, trimethylol propane trimethacrylate, and isobornyl methacrylate.

9. The photocurable composition of claim 1, further comprising a particulate filler in an amount of 5 to 60 vol % based on the total volume of the photocurable composition.

10. The photocurable composition of claim 9,
wherein the particulate filler comprises silica, alumina, calcium titanate, strontium titanate, barium titanate, barium nonatitanate, boron nitride, aluminum nitride, or a combination thereof.

11. The photocurable composition of claim 1, wherein the photoinitiation composition further comprises an ultraviolet light-absorbing agent in an amount of 0.01 to 10 weight percent, based on the total weight of the photoreactive oligomer component, the photoreactive monomer component, and the photoinitiation composition, which totals 100 weight percent.

12. The photocurable composition of claim 1, wherein the photoinitiation composition further comprises scintillating agent in an amount of 0.01 to 2 weight percent, based on the total weight of the photoreactive oligomer component, the photoreactive monomer component, and the photoinitiation composition and totals 100 weight percent.

13. The photocurable composition of claim 1, having a relative permittivity of 2 to 12 at 10 gigahertz.

14. A three-dimensional structure comprising a photocured product of the composition of claim 1.

15. The three-dimensional structure of claim 14, having a dielectric loss of less than 0.004 at 10 GHz as determined by split-post dielectric resonator testing at 10 gigahertz at a temperature of 23° C.

16. The three-dimensional structure of claim 14, wherein the structure is porous.

17. An electronic device comprising the three-dimensional structure of claim 14.

18. The electronic device of claim 17, wherein the device is an impedance-matching layer, a dielectric waveguide, a lens, a reflective array, an antenna matching structure, a superstrate, a coupler, a divider, a radome, or a dielectric antenna, wherein at least one electrical conductor is disposed on or in contact with the photocured product.

19. A stereolithographic method of manufacture of a three-dimensional polymer structure, the method comprising:
providing a volume comprising the photocurable composition of claim 1;
irradiating a portion of the composition with activating radiation in a pattern to form a photocured layer of the structure;
contacting the layer with the photocurable composition;
irradiating the photocurable composition with activating radiation in a pattern to form a second photocured layer on the first layer; and
repeating the contacting and irradiating to form the three-dimensional polymer structure.

20. The method of claim 19, further comprising thermally curing the three-dimensional structure.

21. A three-dimensional structure made by the method of claim 19 wherein the structure is porous.

22. An electronic device comprising the three-dimensional structure of claim 21, wherein the device is an impedance-matching layer, a dielectric waveguide, a lens, a reflective array, an antenna matching structure, a superstrate, a coupler, a divider, a radome, or a dielectric antenna.

23. The photocurable composition of claim 1, having a dielectric loss of less than 0.004.

24. The photocurable composition of claim 3, wherein the hydrophobic oligomer of the photoreactive oligomer component comprises two or more methacrylate end groups.

25. The photocurable composition of claim 6, wherein the photoreactive monomer comprises two or more methacrylate end groups.

26. The photocurable composition of claim 9, comprising the particulate filler in an amount of 10 to 50 vol %, based on the total volume of the photocurable composition.

27. The photocurable composition of claim 10, wherein the particulate filler comprises alumina, barium nonatitanate, or combination thereof.

28. The photocurable composition of claim 1, wherein the photoreactive monomer component comprises at least 60% by weight of the methacrylate-functional monomer.

29. The photocurable composition of claim 1, wherein the photoreactive monomer component comprises at least 70% by weight of the methacrylate-functional monomer.

* * * * *

UNITED STATES PATENT AND TRADEMARK OFFICE
CERTIFICATE OF CORRECTION

| | |
|---|---|
| PATENT NO. | : 11,401,353 B2 |
| APPLICATION NO. | : 16/887320 |
| DATED | : August 2, 2022 |
| INVENTOR(S) | : Trevor Polidore et al. |

It is certified that error appears in the above-identified patent and that said Letters Patent is hereby corrected as shown below:

In the Claims

At Column 25, Line 60, please delete "8. The photocurable composition of claim 7," and replace with -- 8. The photocurable composition of claim 1, --

Signed and Sealed this
Twentieth Day of September, 2022

*Katherine Kelly Vidal*

Katherine Kelly Vidal
*Director of the United States Patent and Trademark Office*